(12) United States Patent
Tokuno et al.

(10) Patent No.: US 9,379,703 B2
(45) Date of Patent: Jun. 28, 2016

(54) FLEXIBLE TOUCH PANEL

(71) Applicant: NISSHA PRINTING CO., LTD., Kyoto-shi, Kyoto (JP)

(72) Inventors: Katsumi Tokuno, Kyoto (JP); Shuzo Okumura, Kyoto (JP); Ryomei Omote, Kyoto (JP)

(73) Assignee: NISSHA PRINTING CO., LTD., Kyoto (JP)

( * ) Notice: Subject to any disclaimer, the term of this patent is extended or adjusted under 35 U.S.C. 154(b) by 37 days.

(21) Appl. No.: 14/383,446

(22) PCT Filed: Mar. 4, 2013

(86) PCT No.: PCT/JP2013/055855
§ 371 (c)(1),
(2) Date: Sep. 5, 2014

(87) PCT Pub. No.: WO2013/133214
PCT Pub. Date: Sep. 12, 2013

(65) Prior Publication Data
US 2015/0047957 A1      Feb. 19, 2015

(30) Foreign Application Priority Data
Mar. 8, 2012   (JP) ................... 2012-051443

(51) Int. Cl.
*G06F 3/044*   (2006.01)
*H03K 17/96*   (2006.01)
*G06F 3/041*   (2006.01)

(52) U.S. Cl.
CPC ............ *H03K 17/96* (2013.01); *G06F 3/041* (2013.01); *G06F 3/044* (2013.01);
(Continued)

(58) Field of Classification Search
CPC ...................................................... G06F 3/044
USPC ........................................ 200/600; 345/172
See application file for complete search history.

(56) References Cited

U.S. PATENT DOCUMENTS

| 2011/0147054 A1 | 6/2011 | Yamazaki |
| 2011/0165514 A1 | 7/2011 | Yamazaki |

(Continued)

FOREIGN PATENT DOCUMENTS

| EP | 2402845 A2 | 1/2012 |
| JP | H06-067784 A | 3/1994 |

(Continued)

OTHER PUBLICATIONS

International Search Report in PCT/JP2013/055855 dated May 21, 2013.

(Continued)

*Primary Examiner* — Renee S Luebke
*Assistant Examiner* — Ahmed Saeed
(74) *Attorney, Agent, or Firm* — Global IP Counselors, LLP

(57) ABSTRACT

A flexible touch panel comprises a base material sheet; a first axis detection electrode, which is provided on the base material sheet and is patterned concerning a first axis; an insulative layer, which is provided on the first axis detection electrode; a second axis detection electrode, which is provided on the insulative layer and is patterned concerning a second axis that is perpendicular to the first axis; a first routing circuit, which electrically connects the first axis detection electrode to an external part; and a second routing circuit, which electrically connects the second axis detection electrode to an external part.

12 Claims, 9 Drawing Sheets

(52) U.S. Cl.
CPC ............. *G06F 2203/04102* (2013.01); *G06F 2203/04103* (2013.01); *H03K 2017/9613* (2013.01); *H03K 2217/96015* (2013.01)

(56) References Cited

U.S. PATENT DOCUMENTS

| | | | |
|---|---|---|---|
| 2011/0279405 A1* | 11/2011 | Meng | ............ G06F 3/044 345/174 |
| 2012/0038584 A1 | 2/2012 | Liu | |
| 2012/0138348 A1 | 6/2012 | Yamazaki | |
| 2014/0124253 A1 | 5/2014 | Yamazaki | |

FOREIGN PATENT DOCUMENTS

| | | |
|---|---|---|
| JP | 3143012 U | 6/2008 |
| JP | 2009-099498 A | 5/2009 |
| JP | 2010-170515 A | 8/2010 |
| JP | 2011-204037 A | 10/2011 |
| WO | 2010-021224 A1 | 2/2010 |

OTHER PUBLICATIONS

Search Report in the corresponding European Patent Application No. 13758400.9 dated Feb. 16, 2016.

* cited by examiner

FLEXIBLE TOUCH PANEL

CROSS-REFERENCE TO RELATED APPLICATIONS

This U.S. National stage application claims priority under 35 U.S.C. §119(a) to Japanese Patent Application No. 2012-051443, filed in Japan on Mar. 8, 2012, the entire contents of Japanese Patent Application No. 2012-051443 are hereby incorporated herein by reference.

BACKGROUND

1. Field of the Invention

The present invention relates to a touch panel that is thin, easy to bend, and flexible.

2. Background Information

In recent years, instead of keyboards, pointing devices, and the like, touch panels have come to be used as the input apparatuses of portable terminals. Furthermore, in advanced portable terminals, there is a demand for flexible types in place of the rigid types of the conventional art. Consequently, in touch panels used in portable terminals, too, there has come to be a demand for flexibility, namely, for thinness and ease of bending.

Moreover, for two dimensional position detection, touch panels are configured by bonding two electrode substrates with an adhesive sheet. Because the thickness of one electrode substrate is approximately several tens of microns, a conventional touch panel has a thickness of approximately 100 μm or greater and has inferior flexibility.

Furthermore, a technology is known wherein a conductive film substrate is formed using a photosensitive conductive film that comprises a photosensitive resin layer and a conductive layer (e.g., PCT International Publication No. WO2010/021224).

SUMMARY

The conductive film substrate that uses the photosensitive conductive film recited in the abovementioned PCT International Publication No. WO2010/021224 relates to one conductive film substrate. Consequently, because forming a touch panel ultimately requires forming two conductive film substrates, the touch panel has a certain amount of thickness.

Accordingly, an object of the present invention is to provide a touch panel that is thin and easy to bend, namely, that is flexible.

A flexible touch panel according to the present invention comprises: a base material sheet; a first axis detection electrode, which is provided on the base material sheet and is patterned concerning a first axis; an insulative layer, which is provided on the first axis detection electrode; a second axis detection electrode, which is provided on the insulative layer and is patterned concerning a second axis that is perpendicular to the first axis; a first routing circuit, which electrically connects the first axis detection electrode to an external part; and a second routing circuit, which electrically connects the second axis detection electrode to the external part.

In addition, a migration prevention layer may be provided between wirings that constitute the second routing circuit.

Furthermore, the migration prevention layer provided between the wirings that constitute the second routing circuit may be provided flush with the wirings.

Furthermore, the migration prevention layer may be provided flush with the insulative layer, which is provided on the first axis detection electrode.

In addition, the migration prevention layer may be made of a material that is the same as that of the insulative layer.

Furthermore, a warp back prevention layer may be further provided on a bottom surface of the base material sheet.

Furthermore, the migration prevention layer may have a tapered shape, wherein a surface area of a vertex part is smaller than a surface area of a bottom part and its cross sectional shape in the thickness directions tapers from the bottom part to the vertex part.

According to the flexible touch panel of the present invention, adopting a configuration that, instead of two electrode substrates, comprises the first axis detection electrode and the second axis detection electrode as well as the thin insulative layer interposed therebetween makes it possible to provide a touch panel that is thin and easy to bend, that is, flexible.

DETAILED DESCRIPTION OF EMBODIMENTS

Figure 1:
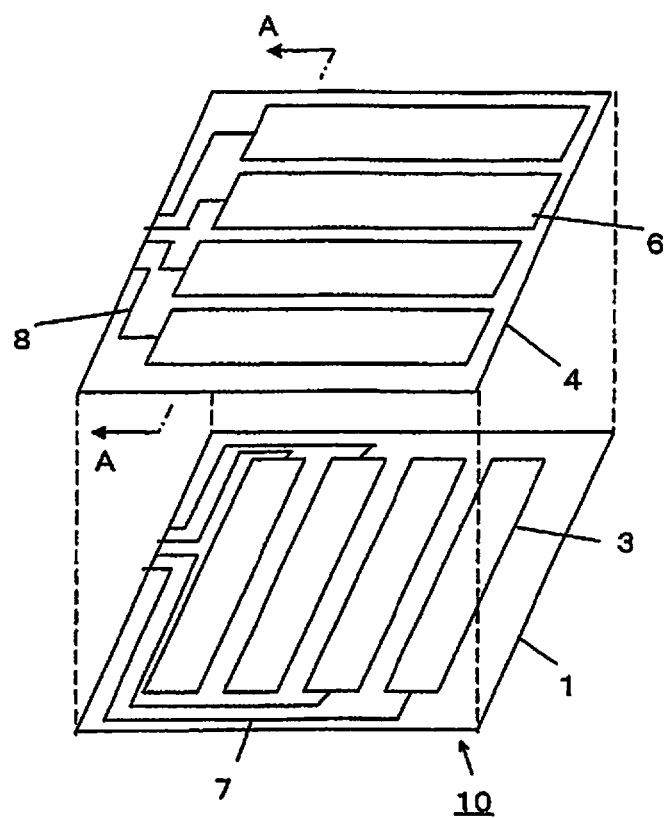
FIG. 1 is an exploded oblique view that shows the configuration of a flexible touch panel according to a first embodiment of the present invention.

A flexible touch panel according to an embodiment of the present invention is explained below, referencing the attached drawings. Furthermore, in the drawings, members that are substantially identical are assigned the same symbols.

First Embodiment

FIG. 1 is an exploded oblique view that shows the configuration of a flexible touch panel 10 according to a first embodiment. The touch panel 10 comprises: a base material sheet 1; x axis detection electrodes 3, which are provided on the base material sheet 1 and are patterned concerning an x axis; an insulative layer 4, which is provided on the x axis detection electrodes 3; y axis detection electrodes 6, which are provided on the insulative layer 4 and are patterned concerning the y axis; a first routing circuit 7, which electrically connects the x axis detection electrodes 3 to an external part; and a second routing circuit 8, which electrically connects the y axis detection electrodes 6 to the external part. Furthermore, the flexible touch panel 10 may be provided with a cover layer 9, which protects a top surface. In addition, the flexible touch panel 10 differs from a conventional touch panel in that, instead of two electrode substrates, the flexible touch panel 10 comprises the x axis detection electrodes 3 and the y axis detection electrodes 6, as well as the thin insulative layer 4 interposed therebetween. According to the flexible touch panel 10 of the first embodiment, adopting the abovementioned configuration makes it possible to make the flexible touch panel 10 thin and easy to bend, namely, flexible.

Figure 10:
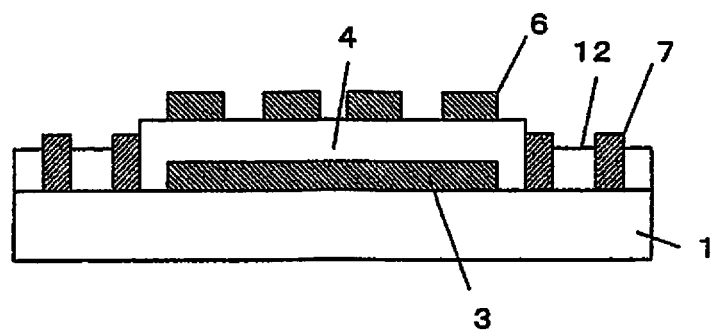
FIG. 10 is a schematic cross sectional view that shows, within the one process of the method of manufacturing the flexible touch panel according to the second embodiment of the present invention, a step wherein alkali development is performed and the uncured insulative layer and conductive layer are removed.

In addition, as shown in the cross sectional view in FIG. 10, the insulative layer 4 does not have to be provided on the first routing circuit 7. Furthermore, as shown in the exploded oblique view in FIG. 1, the first routing circuit 7 and the second routing circuit 8 may be formed such that they lead from the x axis detection electrodes 3 and the y axis detection electrodes 6 toward the end surface in the same direction. In addition, at that end surface, the upper surfaces of the first routing circuit 7 and the second routing circuit 8 do not have to be covered by the insulative layer 4 and the cover layer 9. According to a supplementary configuration related to the first routing circuit 7 and the second routing circuit 8, at that end surface, because the upper surfaces of the first routing circuit 7 and the second routing circuit 8 do not have to be covered by the insulative layer 4 and the cover layer 9, providing a flexible printed circuit (FPC) on the upper surfaces of the first routing circuit 7 and the second routing circuit 8 makes it possible to easily connect the first routing circuit 7, the second routing circuit 8, and the flexible printed circuit (FPC).

The members that constitute the flexible touch panel 10 are explained below.

<Base Material Sheet>

Resin films made of acrylic, polycarbonate, polyester, polybutylene terephthalate, polypropylene, polyamide, polyurethane, polyvinyl chloride, polyvinylfluoride or polyimide are examples that can be given as the material of the base material sheet 1. The thickness of the base material sheet 1 can be set, as appropriate, in the range of 5-800 μM. If the thickness is less than 5 μm, then the strength of the layer is insufficient and the layer tears and the like when it is peeled, which makes handling of the layer difficult; furthermore, if the thickness exceeds 800 μm, then the base material sheet 1 becomes excessively rigid, which makes fabrication difficult and flexibility no longer obtainable.

<x Axis Detection Electrodes and y Axis Detection Electrodes>

In FIG. 1, the x axis detection electrodes 3 and the y axis detection electrodes 6 each comprise a plurality of strip shaped electrodes, but the shapes of the electrodes are not limited to strip shapes. For example, the x axis detection electrodes 3 may comprise a plurality of rhombic electrodes that are connected in diagonal directions, and the y axis detection electrodes 6 may comprise a plurality of rhombic electrodes that are connected in diagonal directions. In such a case, the rhombic electrodes that constitute the x axis detection electrodes 3 and the rhombic electrodes that constitute the y axis detection electrodes 6 may be disposed such that they do not overlap one another when viewed from a direction perpendicular to the plane. Thus, by disposing the x axis detection electrodes 3 and the y axis detection electrodes 6 such that they do not overlap, it is possible to make it such that the detection sensitivities in the x axis and the y axis do not affect one another. In addition, in FIG. 1, the number of the x axis detection electrodes 3 and the number of the y axis detection electrodes 6 is set to four each, but the present invention is not limited thereto, and an arbitrary number can be provided.

In addition, the x axis detection electrodes 3 and the y axis detection electrodes 6 can each be formed by patterning conductive layers 13 and 16. For example, materials made of a photo-curing resin binder—such as urethane acrylate and cyanoacrylate—and conductive nanofibers can be used as the conductive layers 13, 16. In addition, the conductive layers 13, 16 can be provided by various general purpose printing techniques, such as gravure printing, offset printing, and screen printing, and can also be provided by affixing a sheet, such as a dry film made of a photo-curing resin incorporated with conductive nanofibers.

Furthermore, for example, materials made of various resin binders—such as acrylic, polyester, polyurethane, and polyvinyl chloride—and conductive nanofibers can be used as the conductive layers 13, 16. The materials made of various resin binders and conductive nanofibers can be provided by various general purpose printing techniques such as gravure printing, offset printing, and screen printing.

The thicknesses of the conductive layers 13, 16 can be set, as appropriate, in the range of several tens of nanometers to several hundred nanometers. If the thickness is less than several tens of nanometers, then the strength of the layer is insufficient; furthermore, if the thickness is greater than several hundred nanometers, then flexibility is no longer sufficient.

<Conductive Nanofibers>

The abovementioned conductive nanofibers have aspect ratios in the range of approximately 10-100,000. If the aspect ratio is large, then the conductive nanofibers tend to contact one another and thereby the x axis detection electrodes 3 and the y axis detection electrodes 6 can be formed as effective electrodes. In addition, because the overall density of the conductive nanofibers is reduced in order to achieve high transparency, it is advantageous for obtaining the x axis detection electrodes 3 and the y axis detection electrodes 6 such that they have high transparency. Namely, using conductive nanofibers that have high aspect ratios makes it possible to sufficiently reduce the density of the conductive nanofibers such that the x axis detection electrodes 3 and the y axis detection electrodes 6 are substantially transparent.

In addition, if the diameter d of the conductive nanofibers increases, then the resistivity becomes substantially small and the electrical conductivity becomes satisfactory; meanwhile, because a greater amount of light is absorbed, the light transmittance decreases. As a result, transparency worsens. In addition, the effect on resistivity based on the grain boundary and surface scattering increases when the diameter becomes less than 10 nm. When the diameter increases, these effects decrease sharply. The overall resistivity of the x axis detection electrodes 3 and the y axis detection electrodes 6 decreases significantly as the diameter of the conductive nanofibers increases from 10 nm to 100 nm. However, the abovementioned improvement in electrical characteristics must be balanced against the decrease in the transparency of the transparent conductive films.

For example, silver, gold, copper, nickel, gold plated silver, aluminum, and the like can be used as the conductive nanofibers. Specifically, examples that can be given as conductive nanofibers include: metal nanofibers that are prepared by causing an impressed voltage or an electric current from a tip part of a probe to act upon the surface of a precursor that carries metal ions of gold, silver, platinum, copper, palladium, and the like, and continuously drawing the fiber; and peptide nanofibers that are made by forming, by self assembly, a peptide and its derivative and then adding metal particles to the nanofibers. In addition, even in the case wherein the conductive nanofibers are blackish, such as carbon nanotubes, it is applicable if a difference can be recognized in, for example, the color or the reflectivity of the shadow. Furthermore, the conductive nanofibers are not limited to the abovementioned examples. Silver nanofibers are particularly preferable as the conductive nanofibers.

<Insulative Layer>

Any resin can be used as the insulative layer 4 as long as it is a generally used insulative resin. In addition, the insulative layer 4 can be obtained by providing the photosensitive resin layer 14 and then curing such. A normally used urethane acrylate, a photo-curing resin such as cyanoacrylate, or the like can be used as the photosensitive resin layer 14. Furthermore, the photo-curing resin may be a resin that is cured by light in a wavelength region other than visible light, ultraviolet light, and the like.

<First Routing Circuit and Second Routing Circuit>

The first routing circuit 7 acquires electrical signals generated by the x axis detection electrodes 3 and outputs to the external part. In addition, the second routing circuit 8 acquires electrical signals generated by the y axis detection electrodes 6 and outputs to the external part. Any material can be used as the first routing circuit 7 and the second routing circuit 8 as long as it is an electrically conductive material that is normally used as electrical wiring. For example, silver paste can be used. Alternatively, it may be a material that includes conductive nanofibers, as in the abovementioned conductive layers 13, 16.

Furthermore, as shown in, for example, the cross sectional view in FIG. 10, the insulative layer 4 does not have to be provided on the first routing circuit 7. Furthermore, as shown in the exploded oblique view in FIG. 1, the first routing circuit 7 and the second routing circuit 8 may be formed such that they lead from the x axis detection electrodes 3 and the y axis detection electrodes 6 to the end surface in the same direction. In addition, at that end surface, the upper surfaces of the first routing circuit 7 and the second routing circuit 8 do not have to be covered by the insulative layer 4 and the cover layer 9. In addition, at that end surface, the first routing circuit 7 and the second routing circuit 8 may be disposed planarly spaced apart from one another such that they do not overlap on the base material sheet 1.

If the touch panel is formed by overlapping two electrode substrates as in the conventional art, then the flexible printed circuit (FPC) is interposed between the two electrode substrates, and the first routing circuit and the second routing circuit are connected to the external part. Specifically, the flexible printed circuit interposed between the two electrode substrates is connected to the first routing circuit of the lower side electrode substrate, and the second routing circuit of the upper side electrode substrate are connected via through holes in the upper side electrode substrate. This is a problem in that the touch panel is configured by overlapping two electrode substrates, and therefore the electrode substrates exist not only across the center part but also over the end surfaces, and consequently holes (vias) that pass through the electrode substrates are needed in order to electrically connect with the flexible printed circuit. The present inventors observed the existence of this problem and discovered the abovementioned configuration, which is capable of solving the problem.

Namely, the first routing circuit 7 and the second routing circuit 8 are formed such that they lead from the x axis detection electrodes 3 and the y axis detection electrodes 6 toward the end surface in the same direction; moreover, if a configuration is adopted wherein, at that end surface, the upper surfaces of the first routing circuit 7 and the second routing circuit 8 are not covered by the insulative layer 4 and the cover layer 9, then the connection with the flexible printed circuit (FPC) for externally acquiring the electrical signals detected by the x axis detection electrodes 3 and the y axis detection electrodes 6 can be easily accomplished.

According to the abovementioned configuration, at the end surface, because the upper surfaces of the first routing circuit 7 and the second routing circuit 8 are not covered by the insulative layer 4 and the cover layer 9, the first routing circuit 7 and the second routing circuit 8 can be easily connected to the flexible printed circuit (FPC) without the flexible printed circuit (FPC) being interposed between the two electrode substrates, as in the conventional art, and without transiting vias and the like by providing the flexible printed circuit (FPC) to the upper surfaces of the first routing circuit 7 and the second routing circuit 8.

<Cover Layer>

The cover layer 9 may be provided, as needed, in order to protect the flexible touch panel 10. For example, a generally used insulative resin may be used as the cover layer 9, as in the insulative layer 4.

Second Embodiment

Figure 2:
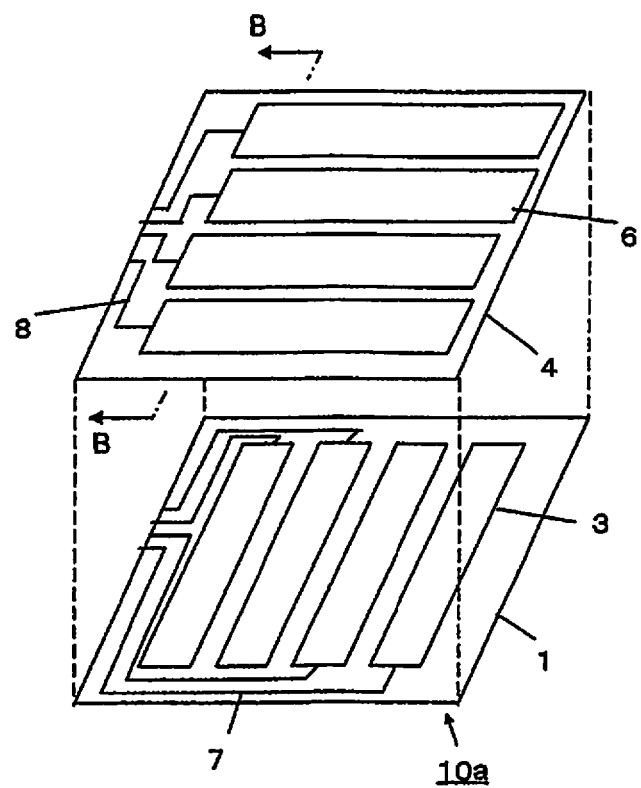
FIG. 2 is an exploded oblique view that shows the configuration of the flexible touch panel according to a second embodiment of the present invention.
Figure 3:
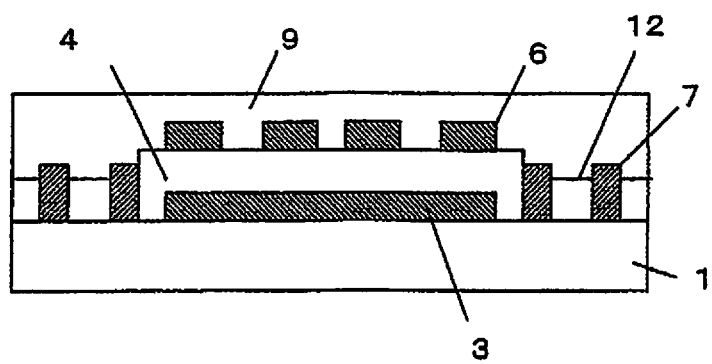
FIG. 3 is a cross sectional view of the flexible touch panel, viewed from the B-B direction in FIG. 2.

FIG. 2 is an exploded oblique view that shows the configuration of a flexible touch panel 10a according to a second embodiment. FIG. 3 is a cross sectional view of the flexible touch panel 10a, viewed from the B-B direction in FIG. 2. The flexible touch panel 10a is characterized by having a migration prevention layer 12 between the wirings that constitute the first routing circuit 7.

Here, "migration" is a phenomenon wherein the metal component with which the wiring is formed moves over the insulator owing to the effect of the electric field between the wirings, and thereby an electrical short circuit arises between adjacent wirings. The ion migration of silver in particular is viewed as a problem, and there is a demand to prevent electromigration in wirings wherein silver paste, silver nanofibers, or the like are used. As described above, the flexible touch panel 10a according to the second embodiment comprises the migration prevention layer 12 between the wirings of the first routing circuit 7. This is effective in preventing migration between the wirings that constitute the first routing circuit 7. Furthermore, by providing the migration prevention layer 12 between the wirings of the first routing circuit 7, if the cover layer 9 is provided such that it covers the spaces between the wirings of the first routing circuit 7, then the migration prevention layer 12 will be covered by the cover layer 9 such that the recesses between the wirings of the first routing circuit 7 are filled in. Thereby, when forming the touch panel with a smooth top surface, the thickness of the cover layer 9 can be reduced proportionate to the recesses filled by the migration prevention layer 12. As a result, it is possible to obtain the flexible touch panel 10a such that it is, overall, thin and flexible.

The migration prevention layer 12 is made of an insulative layer. In addition, the migration prevention layer 12 can be formed by providing a photosensitive resin layer between the wirings of the first routing circuit 7, and then exposing such to cure the photosensitive resin layer. The same photosensitive resin layer used in the first embodiment can be used as the present photosensitive resin layer.

<Flexible Touch Panel Manufacturing Method>

FIG. 4 through FIG. 11 are schematic cross sectional views that show each step of the method of manufacturing the flexible touch panel 10a according to the second embodiment. Furthermore, each cross sectional view corresponds to the cross sectional view viewed from the B-B direction in FIG. 2. The method of manufacturing the flexible touch panel 10a is explained below.

(1) Prepare the base material sheet 1. The materials described above can be used as the base material sheet.

Figure 4:
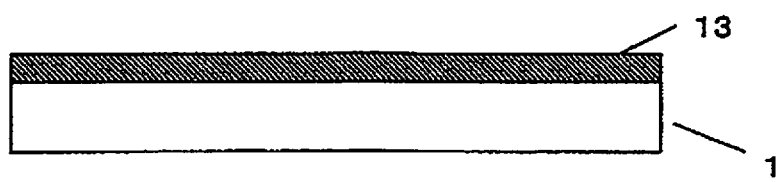
FIG. 4 is a schematic cross sectional view that shows, within one process of a method of manufacturing the flexible touch panel according to the second embodiment of the present invention, a step wherein a conductive layer is provided on a base material sheet.

(2) Provide the conductive layer 13 on the base material sheet 1 (FIG. 4).

Figure 5:
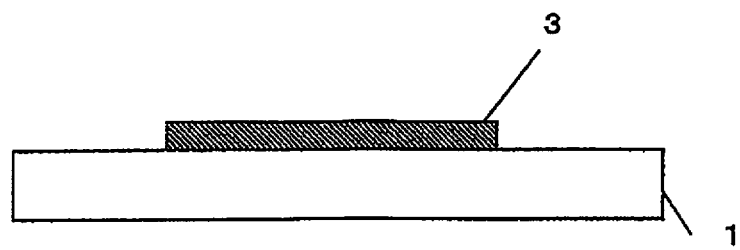
FIG. 5 is a schematic cross sectional view that shows, within the one process of the method of manufacturing the flexible touch panel according to the second embodiment of the present invention, a step wherein the conductive layer is patterned.

(3) Pattern the conductive layer 13 concerning the x axis and form the x axis detection electrodes 3 (FIG. 5).

Figure 6:
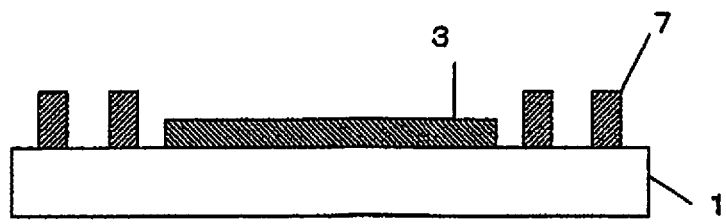
FIG. 6 is a schematic cross sectional view that shows, within the one process of the method of manufacturing the flexible touch panel according to the second embodiment of the present invention, a step wherein a first routing circuit are provided.

(4) Provide the first routing circuit 7, which acquires the electrical signals generated by the x axis detection electrodes 3 and outputs to the external part (FIG. 6).

Figure 7:
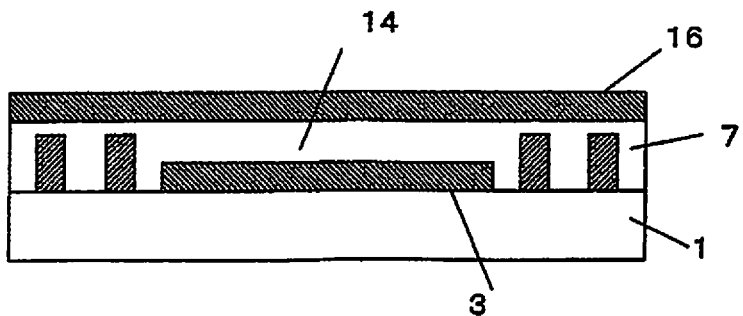
FIG. 7 is a schematic cross sectional view that shows, within the one process of the method of manufacturing the flexible touch panel according to the second embodiment of the present invention, a step wherein an insulative layer and a conductive layer are provide.

(5) Provide the photosensitive resin layer 14 and the conductive layer 16 on the patterned x axis detection electrodes 3 (FIG. 7). Furthermore, here, the film wherein the photosensitive resin layer 14 and the conductive layer 16 are stacked is affixed, but the present invention is not limited thereto, and the step that provides the photosensitive resin layer 14 and the step that provides the conductive layer 16 may be performed in order.

Figure 8:
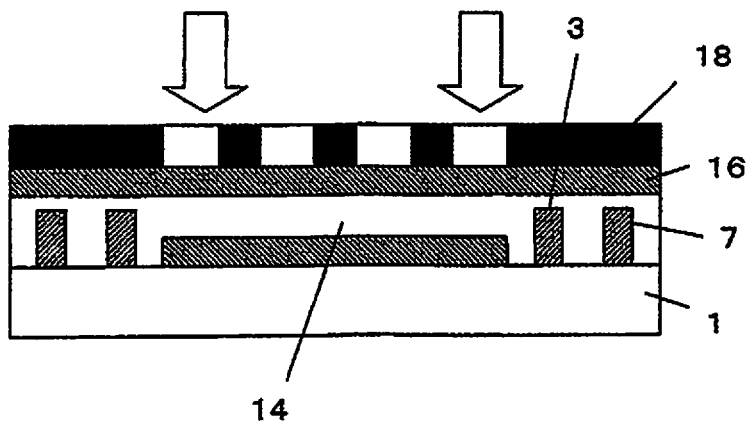
FIG. 8 is a schematic cross sectional view that shows, within the one process of the method of manufacturing the flexible touch panel according to the second embodiment of the present invention, a step wherein a mask is provided and an exposure is performed from above.

(6) Provide a mask 18, which has windows at the locations of the conductive layer 16 at which the electrodes are to be provided, then expose that mask 18 from above to cure the photosensitive resin layer 14 (FIG. 8).

Figure 9:
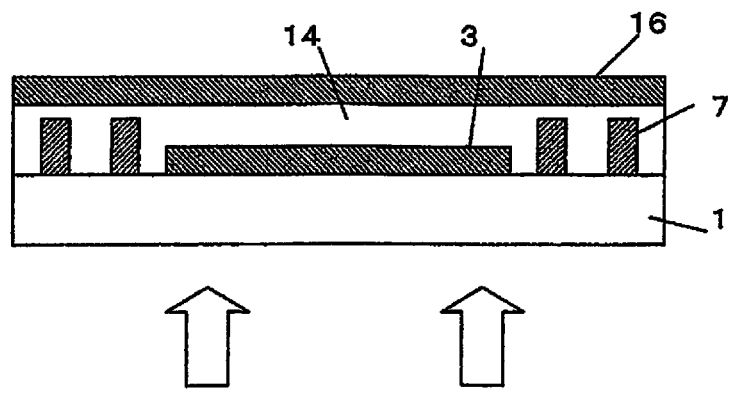
FIG. 9 is a schematic cross sectional view that shows, within the one process of the method of manufacturing the flexible touch panel according to the second embodiment of the present invention, a step wherein the mask is removed and an exposure is performed from a bottom surface.

(7) Remove the mask 18 and expose the base material sheet 1 from the bottom surface (FIG. 9).

(8) By performing alkali development or etching using an acid and by performing an exposure from the top surface or the bottom surface, the locations at which the photosensitive resin 14 were set remain, along with the conductive layer 16 thereabove. Moreover, the photosensitive resin 14 at the portions that were covered by the mask 18, and therefore not exposed during the exposure from the top surface, and the portions that were covered by the x axis detection electrodes 3 and the first routing circuit 7, and therefore were also not exposed during the exposure from the bottom surface, is uncured, and is consequently removed. As a result, the photosensitive resin 14 is cured and the insulative layer 4 is thereby formed. In addition, the y axis detection electrodes 6 are formed by the patterning of the conductive layer 16 concerning the y axis. Furthermore, the migration prevention layer 12 can be formed between the wirings of the first routing circuit 7 (FIG. 10). The migration prevention layer 12 can prevent migration between the wirings that constitute the first routing circuit 7. Furthermore, the insulative layer 4 is not provided on the first routing circuit 7.

(9) Provide the second routing circuit 8, which acquires the electrical signals generated by the y axis detection electrodes 6 and outputs to the external part (not shown). Furthermore, the second routing circuit 8 does not appear in the cross sectional view, which is viewed from the B-B direction in FIG. 2. In addition, the second routing circuit 8 may be formed toward the same end surface as the first routing circuit 7. Furthermore, the second routing circuit 8 may be provided directly on the base material sheet 1. Furthermore, at the end surface, the first routing circuit 7 and the second routing circuit 8 may be disposed planarly spaced apart from one another such that they do not overlap on the base material sheet 1.

Figure 11:
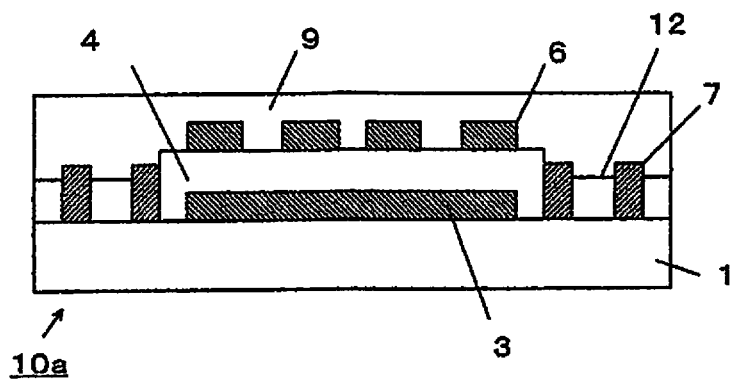
FIG. 11 is a schematic cross sectional view that shows, within the one process of the method of manufacturing the flexible touch panel according to the second embodiment of the present invention, a step wherein a cover layer is provided and the flexible touch panel is thereby obtained.

(10) Provide the cover layer 9 such that it covers the y axis detection electrodes 6 (FIG. 11). In this case, at the end surface, the cover layer 9 does not have to be provided on the upper surfaces of the first routing circuit 7 and the second routing circuit 8. If the migration prevention layer 12 is provided between the wirings of the first routing circuit 7 and the cover layer 9 is provided such that it covers the spaces between the wirings of the first routing circuit 7, then the migration prevention layer 12 is covered by the cover layer 9 such that the recesses between the wirings of the first routing circuit 7 are filled in. Accordingly, when forming the touch panel with a smooth top surface, the thickness of the cover layer 9 can be reduced proportionate to the recesses filled by the migration prevention layer 12. As a result, it is possible to obtain the flexible touch panel 10a such that it is, overall, thin and flexible.

(11) At the end surface, provide the flexible printed circuit (FPC) on the upper surfaces of the first routing circuit 7 and the second routing circuit 8, and connect the first routing circuit 7 and the second routing circuit 8 to the flexible printed circuit (FPC) (not shown). In this case, because the first routing circuit 7 and the second routing circuit 8 are formed such that they lead from the x axis detection electrodes 3 and the y axis detection electrodes 6 toward the end surface in the same direction and, moreover, at the end surface, the upper surfaces of the first routing circuit 7 and the second routing circuit 8 are not covered by the insulative layer 4 and the cover layer 9, the first routing circuit 7 and the second routing circuit 8 can be easily connected to the flexible printed circuit (FPC).

Based on the above, the flexible touch panel 10a can be obtained.

Third Embodiment

Figure 12:
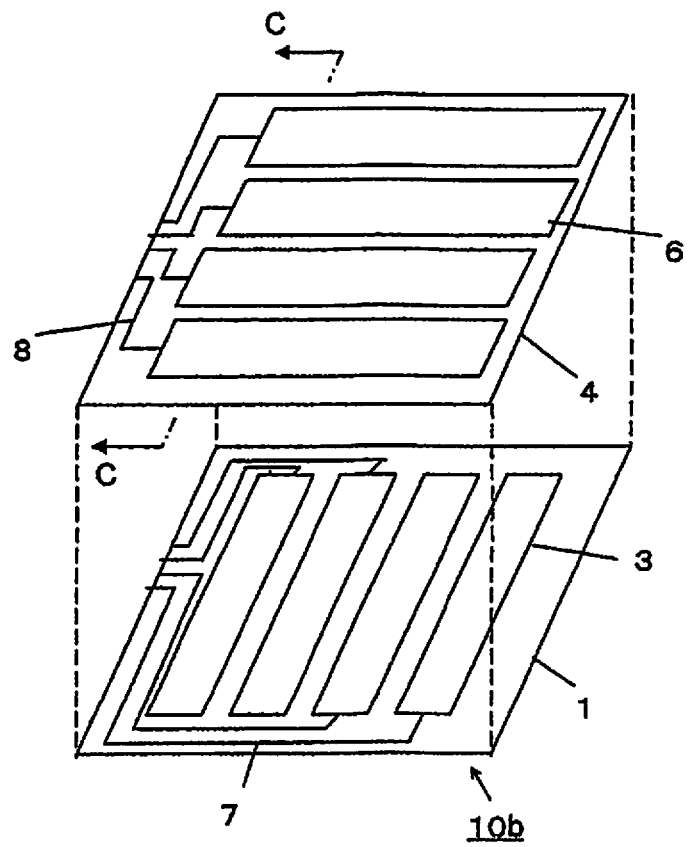
FIG. 12 is an exploded oblique view that shows the configuration of the flexible touch panel according to a third embodiment of the present invention.
Figure 13:
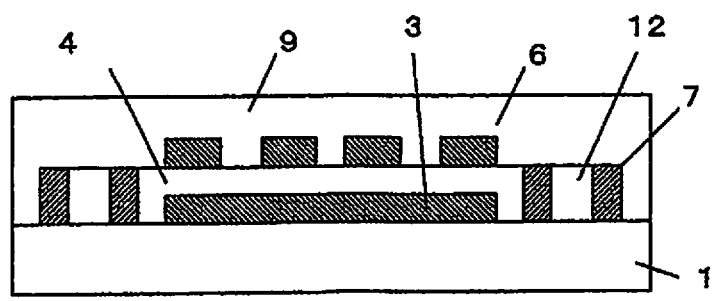
FIG. 13 is a cross sectional view of the flexible touch panel, viewed from the C-C direction in FIG. 12.

FIG. 12 is an exploded oblique view that shows the configuration of a flexible touch panel 10b according to a third embodiment. FIG. 13 is a cross sectional view of the flexible touch panel 10b, viewed from the C-C direction in FIG. 12. In the touch panel 10b, as shown in FIG. 13, the migration prevention layer 12 is provided flush with the wirings that constitute the second routing circuit 8. Furthermore, the migration prevention layer 12 is provided flush with the insulative layer 4, too. By adopting such a configuration, the step between the center part of the flexible touch panel 10b, that is, the display part that comprises the x axis detection electrodes 3, the insulative layer 4, the y axis detection electrodes 6, and the migration prevention layer 12, and the end parts of the flexible touch panel 10b, that is, the peripheral edge parts that comprise the first routing circuit 7, can be substantially eliminated.

The thickness of the y axis detection electrodes 6 formed on the insulative layer 4 is approximately several tens of nanometers, whereas the thickness of the first routing circuit 7 and the migration prevention layer 12 is approximately several tens of microns. Namely, compared with the thickness of the first routing circuit 7 and the migration prevention layer 12, the thickness of the y axis detection electrodes 6 can be ignored. Consequently, if the cover layer 9 is provided such that it covers the insulative layer 4, the y axis detection electrodes 6, the first routing circuit 7, and the migration prevention layer 12, then the cover layer is affixed, without slackening, between the abovementioned center part and end parts. As a result, it is possible to prevent the occurrence of iridescent irregularity between the center part and the end parts, the entrapment of air, and the like. Furthermore, because the thickness of the insulative layer 4 and the thickness of the first routing circuit 7 and the migration prevention layer 12 are the same, it is also possible to prevent the entrapment of air between the insulative layer 4 and the migration prevention layer 12 when affixing the cover layer 9.

Fourth Embodiment

Figure 14:
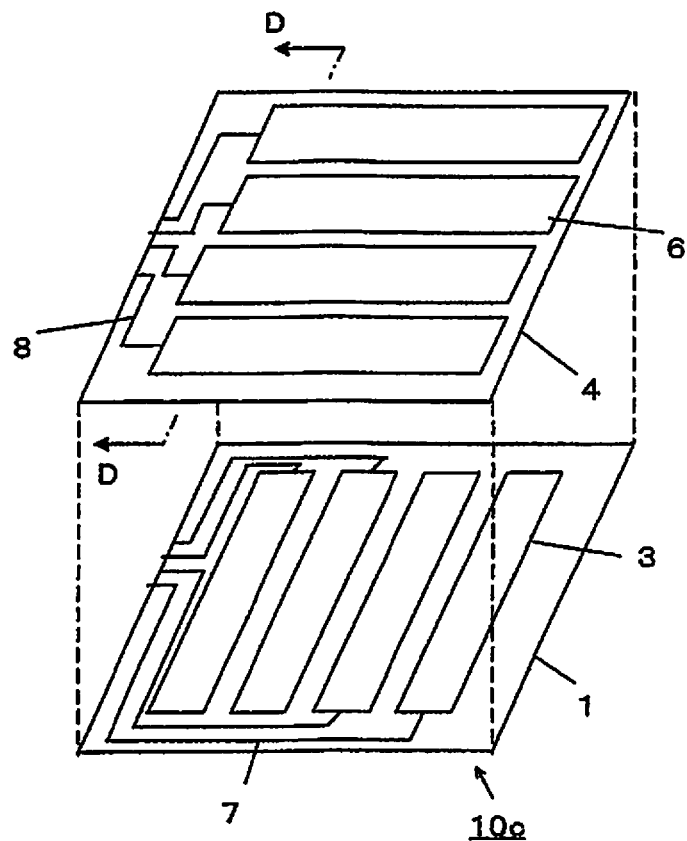
FIG. 14 is an exploded oblique view that shows the configuration of the flexible touch panel according to a fourth embodiment of the present invention.
Figure 15:
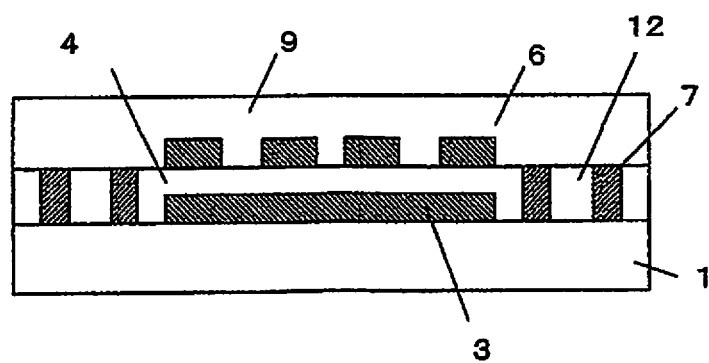
FIG. 15 is a cross sectional view of the flexible touch panel, viewed from the D-D direction in FIG. 14.

FIG. 14 is an exploded oblique view that shows the configuration of a flexible touch panel 10c according to a fourth embodiment. FIG. 15 is cross sectional view of the flexible touch panel 10c, viewed from the D-D direction in FIG. 14. In the present flexible touch panel 10c, the insulative layer 4 is formed, with the same thickness as that of the migration prevention layer 12, also in the outer edge parts of the area wherein the first routing circuit 7 is formed, and furthermore is made of the same material as that of the migration prevention layer 12. By adopting such a configuration, when the migration prevention layer 12 and the insulative layer 4 have been formed on the base material sheet 1, the contraction coefficients within the areas wherein the migration prevention layer 12 and the insulative layer 4 are formed are identical because the thickness and the materials of the migration prevention layer 12 and insulative layer 4 are the same. As a result, it is possible to prevent the occurrence of unevenness between the display part and the end parts of the produced flexible touch panel 10c that arises owing to a difference in the contraction coefficients of the migration prevention layer 12 and the insulative layer 4.

Fifth Embodiment

Figure 16:
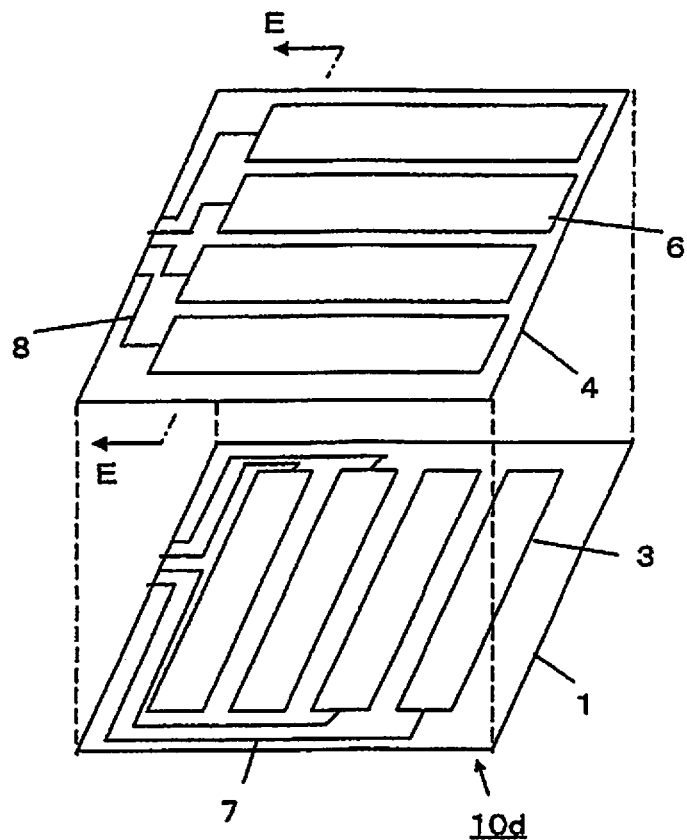
FIG. 16 is an exploded oblique view that shows the configuration of the flexible touch panel according to a fifth embodiment of the present invention.
Figure 17:
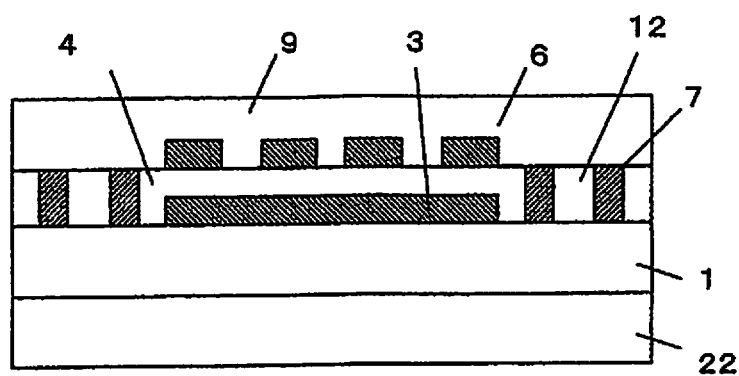
FIG. 17 is a cross sectional view of the flexible touch panel, viewed from the E-E direction in FIG. 16.

FIG. 16 is an exploded oblique view that shows the configuration of a flexible touch panel 10d according to a fifth embodiment. FIG. 17 is a cross sectional view of the flexible touch panel 10d, viewed from the E-E direction in FIG. 16. The present flexible touch panel 10d is characterized in that it further comprises a warp back prevention layer 22, whose thickness and material are the same as that of the migration prevention layer 12 and the insulative layer 4, on the bottom surface of the base material sheet 1. Adopting a configuration in this manner makes it possible to eliminate stress (contraction stress) that arises on the top surface side of the base material sheet 1 when the migration prevention layer 12 and the insulative layer 4 have been formed on the base material sheet 1. As a result, it is possible to reduce the incidence of curling of the flexible touch panel 10d as a whole.

Sixth Embodiment

Figure 18:
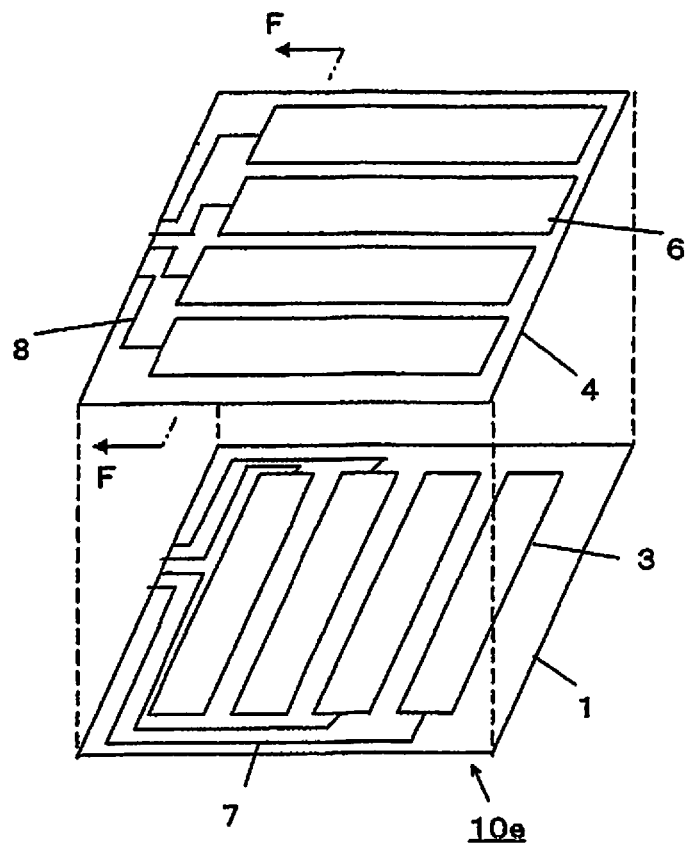
FIG. 18 is an exploded oblique view that shows the configuration of the flexible touch panel according to a sixth embodiment of the present invention.
Figure 19:
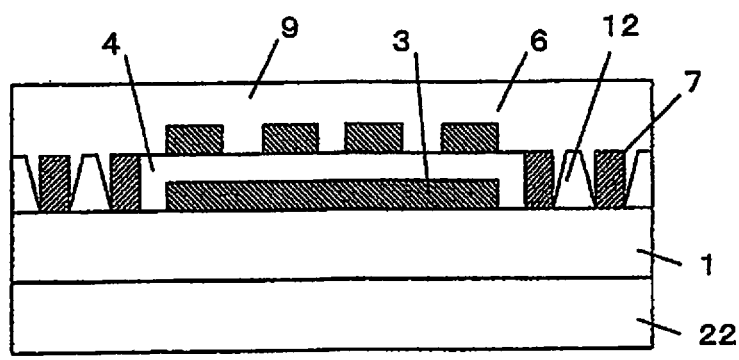
FIG. 19 is a cross sectional view of the flexible touch panel, viewed from the F-F direction in FIG. 18.

FIG. 18 is an exploded oblique view the shows the configuration of a flexible touch panel 10e according to a sixth embodiment. FIG. 19 is a cross sectional view of the flexible touch panel 10e, viewed from the F-F direction in FIG. 18. The present flexible touch panel 10e is characterized in that the migration prevention layer 12 has taper shapes, wherein each of surface areas of a vertex part is smaller than each of surface areas of a bottom part and its cross sectional shape in the thickness directions tapers from the bottom part to the vertex part. Adopting a configuration in this manner makes it possible to allow for flexure at the end parts of the flexible touch panel 10e, namely, at the locations at which the second routing circuit 8 are formed—even if the top surface of the base material sheet 1 is bent into a concave shape—because constant play portions are provided between the wirings that constitute the second routing circuit 8. Moreover, the tapered migration prevention layer 12 makes it possible to space the wirings apart from one another such that they do not contact one another. As a result, it is possible to make the flexible touch panel 10e such that it can prevent short circuits among the second routing circuit 8 while having flexibility at the end parts.

Furthermore, the effects possessed by each of the embodiments can be achieved by appropriately combining arbitrary embodiments of the abovementioned various embodiments.

Although the present invention is sufficiently described in relation to the preferred embodiments with reference to the attached drawings, it is obvious that a person skilled in the art could effect a variety of variations and modifications. It is understood that such variations and modifications are included therein unless they deviate from the scope of the present invention according to the attached claims.

The flexible touch panel according to the present invention has utility as a touch panel that is thin and easy to bend, that is, flexible. Because the present flexible touch panel is flexible, it can be combined with a curved surface shape display and the like.

The invention claimed is:
1. A flexible touch panel comprising:
   a base material sheet made of insulative resin film having a first main surface;
   a first axis detection electrode provided on the base material sheet and patterned concerning a first axis, the first axis detection electrode having a first main surface directly contacting the first main surface of the base material sheet, a second main surface and a side surface extending between the first and second main surfaces;
   an insulative layer provided on the first axis detection electrode, the insulative layer directly contacting the first main surface of the base material sheet, the second main surface of the first axis detection electrode, and the side surface of the first axis detection electrode;
   a second axis detection electrode provided on the insulative layer and patterned concerning a second axis that is perpendicular to the first axis, the second axis detection electrode directly contacting the insulative layer;

a first routing circuit electrically connecting the first axis detection electrode to an external part, the first routing circuit comprising wirings, each of the wirings having a first main surface directly contacting the first main surface of the base material sheet and a second main surface that is opposite the first main surface and faces away from the first main surface of the base material sheet;

a second routing circuit electrically connecting the second axis detection electrode to the external part; and a migration prevention layer provided between the wirings of the first routing circuit and directly contacting the first main surface of the base material sheet without covering the second main surface of any of the wirings.

2. The flexible touch panel according to claim 1, wherein the migration prevention layer provided between the wirings that constitute the first routing circuit is provided flush with the wirings.

3. The flexible touch panel according to claim 2, wherein the migration prevention layer is provided flush with the insulative layer provided on the first axis detection electrode.

4. The flexible touch panel according to claim 3, wherein the migration prevention layer is made of a material that is the same as that of the insulative layer.

5. The flexible touch panel according to claim 1, further comprising
a warp back prevention layer provided on a bottom surface of the base material sheet.

6. The flexible touch panel according to claim 1, wherein the first axis detection electrode includes conductive nanofibers.

7. The flexible touch panel according to claim 1, wherein the insulative layer directly contacts a side surface of the first routing circuit.

8. A method of manufacturing the flexible touch panel as recited claim 1, comprising:
forming a first conductive layer provided directly on the base material sheet;
forming the first axis detection electrode by patterning the first conductive layer concerning the first axis;
forming the first routing circuit provided directly on the base material sheet;
forming a photosensitive resin layer and a second conductive layer, the photosensitive resin layer provided directly on the first conductive layer and the first routing circuit, the second conductive layer provided directly on the photosensitive resin;
forming the second axis detection electrode by patterning the second conductive layer concerning the second axis, patterning the second conductive layer including providing a mask on the second conductive layer, exposing the mask from above and removing the mask;
forming the insulative layer by exposing the base material sheet from the other main surface of the base material sheet and by performing alkali development or etching using an acid; and
forming the second routing circuit.

9. The method according to claim 8, wherein
the forming of the first conductive layer forms the first conductive layer including conductive nanofibers.

10. The flexible touch panel according to claim 1, further comprising
a cover layer provided on the migration prevention layer and the second main surface of the wirings.

11. The flexible touch panel according to claim 10, wherein the cover layer is further provided on the insulative layer and the second axis detection electrode.

12. A flexible touch panel comprising:
a base material sheet;
a first axis detection electrode provided on the base material sheet and patterned concerning a first axis;
an insulative layer provided on the first axis detection electrode;
a second axis detection electrode provided on the insulative layer and patterned concerning a second axis that is perpendicular to the first axis;
a first routing circuit electrically connecting the first axis detection electrode to an external part;
a second routing circuit electrically connecting the second axis detection electrode to the external part; and
a migration prevention layer, which is provided between wirings that constitute the second routing circuit, the migration prevention layer having a tapered shape, such that a surface area of a vertex part is smaller than a surface area of a bottom part and its cross sectional shape in the thickness directions tapers from the bottom part to the vertex part.

* * * * *